US012652970B2

(12) United States Patent
Nguyen et al.

(10) Patent No.: US 12,652,970 B2
(45) Date of Patent: Jun. 9, 2026

(54) RESISTIVE SWITCHING IN A RRAM DEVICE

(71) Applicant: New Jersey Institute of Technology, Newark, NJ (US)

(72) Inventors: Hieu Nguyen, Dover, NJ (US); Ravi Teja Velpula, Colonia, NJ (US); Barsha Jain, Colonia, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 426 days.

(21) Appl. No.: 18/242,423

(22) Filed: Sep. 5, 2023

(65) Prior Publication Data

US 2024/0107904 A1 Mar. 28, 2024

Related U.S. Application Data

(60) Provisional application No. 63/410,293, filed on Sep. 27, 2022.

(51) Int. Cl.
H10N 70/00 (2023.01)
H10B 63/00 (2023.01)

(52) U.S. Cl.
CPC ........... H10N 70/883 (2023.02); H10B 63/80 (2023.02); H10N 70/841 (2023.02)

(58) Field of Classification Search
CPC ........................... H10N 70/826; H10N 70/883
See application file for complete search history.

(56) References Cited

U.S. PATENT DOCUMENTS 10,490,738 B2 * 11/2019 Govoreanu ............ H10B 63/80
12,389,814 B2 * 8/2025 Chen .................... H10N 70/021

OTHER PUBLICATIONS

R. Waser and M. Aono, "Nanoionics-based resistive switching memories," in Nanoscience and technology: A collection of reviews from nature journals: World Scientific, 2010, pp. 158-165.
K. M. Persson, M. S. Ram, O. P. Kilpi, M. Borg, and L. E. Wernersson, "Cross?Point Arrays with Low?Power ITO? HfO2 Resistive Memory Cells Integrated on Vertical III?V Nanowires," Advanced Electronic Materials, vol. 6, No. 6, p. 2000154, 2020.
M.-H. Kim et al., "Uniformity improvement of SiN x-based resistive switching memory by suppressed internal overshoot current," IEEE Transactions on Nanotechnology, vol. 17, No. 4, pp. 824-828, 2018.
Y. Y. Chen et al., "Improvement of data retention in HfO 2/Hf 1T1R RRAM cell under low operating current," in 2013 IEEE International Electron Devices Meeting, 2013: IEEE, pp. 10.1. 1-10.1. 4.
S. Gaba, F. Cai, J. Zhou, and W. D. Lu, "Ultralow sub-1-nA operating current resistive memory with intrinsic non-linear characteristics," IEEE Electron Device Letters, vol. 35, No. 12, pp. 1239-1241, 2014.

(Continued)

*Primary Examiner* — Mark V Prenty
(74) *Attorney, Agent, or Firm* — McCarter & English, LLP

(57) ABSTRACT

A resistive random access memory (RRAM) device is provided, and includes a top electrode layer, a bottom electrode layer, and an insulating layer positioned between the top electrode layer and the bottom electrode layer. The insulating layer includes a $SiN_x$ layer.

18 Claims, 7 Drawing Sheets

(56)          References Cited

OTHER PUBLICATIONS

J.-W. Huang et al., "The effect of high/low permittivity in bilayer HfO2/BN resistance random access memory," Applied Physics Letters, vol. 102, No. 20, p. 203507, 2013.

N. Vasileiadis et al., "Understanding the role of defects in silicon nitride-based resistive switching memories through oxygen doping," IEEE Transactions on Nanotechnology, vol. 20, pp. 356-364, 2021.

Y. Yang, P. Gao, S. Gaba, T. Chang, X. Pan, and W. Lu, "Observation of conducting filament growth in nanoscale resistive memories," Nature communications, vol. 3, No. 1, pp. 1-8, 2012.

P. Bousoulas, S. Stathopoulos, D. Tsialoukis, and D. Tsoukalas, "Low-power and highly uniform 3-b multilevel switching in forming free TiO 2-x-based RRAM with embedded Pt nanocrystals," IEEE Electron Device Letters, vol. 37, No. 7, pp. 874-877, 2016.

Y. Huang et al., "Amorphous ZnO based resistive random access memory," RSC advances, vol. 6, No. 22, pp. 17867-17872, 2016.

D. Guo et al., "Unipolar resistive switching behavior of amorphous gallium oxide thin films for nonvolatile memory applications," Applied Physics Letters, vol. 106, No. 4, p. 042105, 2015.

G. Gonzalez-Cordero, F. Jimenez-Molinos, J. B. Roldán, M. B. González, and F. Campabadal, "In-depth study of the physics behind resistive switching in TiN/Ti/HfO2/W structures," Journal of Vacuum Science & Technology B, Nanotechnology and Microelectronics: Materials, Processing, Measurement, and Phenomena, vol. 35, No. 1, p. 01A110, 2017.

J. Guo et al., "Influence of Nitrogen Adsorption of Doped Ta on Characteristics of SiNx?Based Resistive Random Access Memory," physica status solidi (a), vol. 216, No. 22, p. 1900540, 2019.

H. Jeon et al., "Resistive switching behaviors of Ti nano-layer embedded TaOx-based devices," Current Applied Physics, vol. 17, No. 2, pp. 230-234, 2017.

* cited by examiner

Figures 1, 2A, 2B:
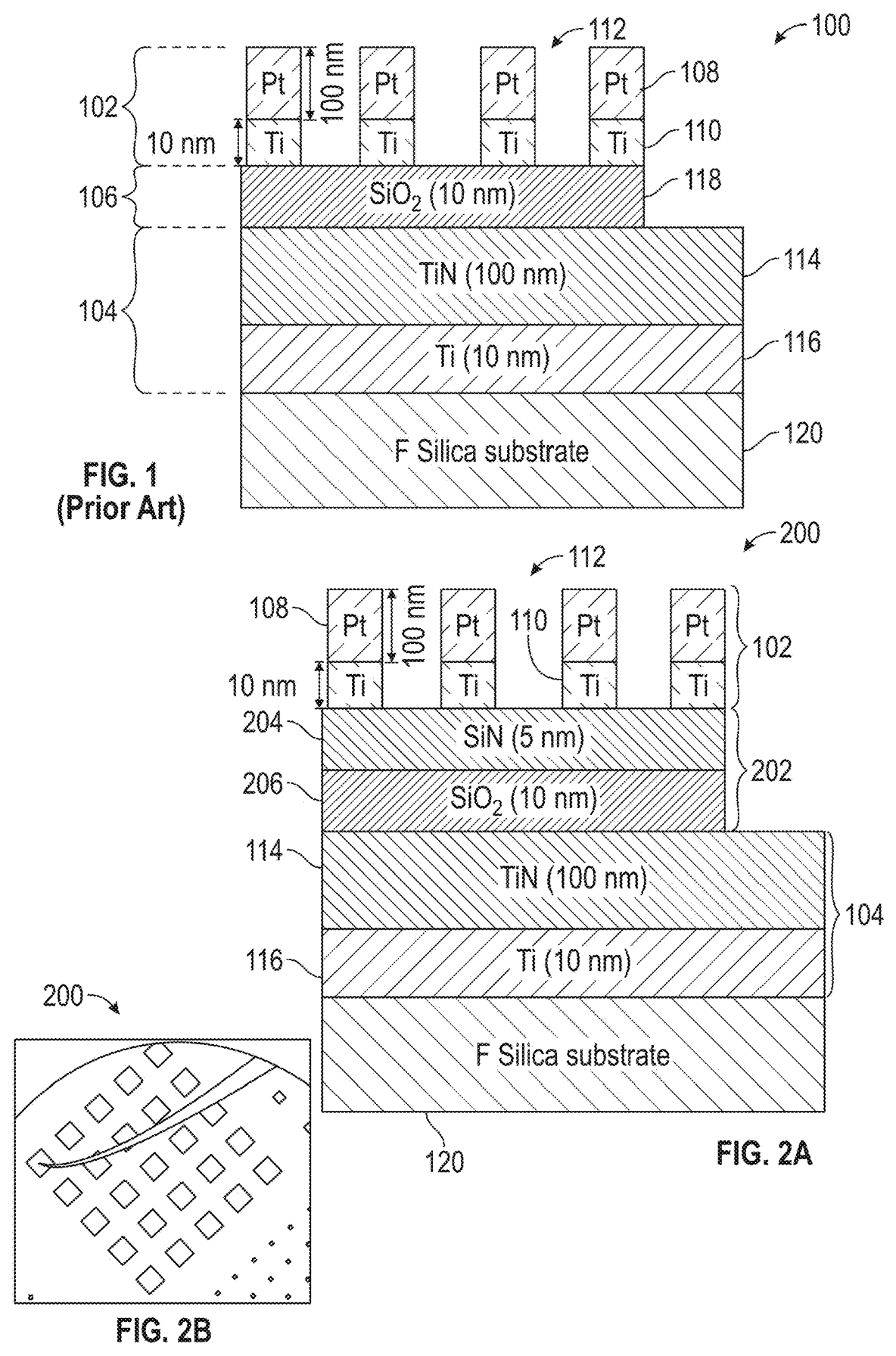

112

100

102

108

100 nm 10 nm

Pt | Pt | Pt | Pt

Ti | Ti | Ti | Ti

110

SiO₂ (10 nm)

118

106

TiN (100 nm)

114

104

Ti (10 nm)

116

F Silica substrate

SiN (5 nm)

206

SiO₂ (10 nm)

202

114

TiN (100 nm)

116

Ti (10 nm)

104

F Silica substrate

Pristine State

SET/LRS State

Reset/HRS State

Pristine State

SET/LRS State

RESET/HRS State

⊗ Recombined Oxygen Vacancy　　x Oxygen ions　　⊕ SiN　　# Nitrogen ions
○ Oxygen Vacancy　　• Electrons　　○ Nitrogen Vacancies

RESISTIVE SWITCHING IN A RRAM DEVICE

CROSS-REFERENCE TO RELATED APPLICATIONS

This application claims the benefit of a commonly assigned U.S. Provisional Patent Application No. 63/410,293, which was filed on Sep. 27, 2022. The entire content of the foregoing provisional application is incorporated herein by reference.

BACKGROUND

Resistive random access memory (RRAM) is one of the emerging memory technologies. A RRAM device generally includes a resistive switching memory cell that has a top metal electrode, a bottom metal electrode, and an insulating resistance switch (RS) layer sandwiched between the two metal electrodes. RRAM has various advantages, including simple structure, fast switching speed, high endurance, long retention, and good scaling properties. (See, e.g., R. Waser et al., "Nanoionics-based resistive switching memories," in *Nanoscience and technology: A collection of reviews from nature journals*: World Scientific, pp. 158-165 (2010); and K. M. Persson et al., "Cross-Point Arrays with Low-Power ITO-HfO2 Resistive Memory Cells Integrated on Vertical III-V Nanowires," *Advanced Electronic Materials*, vol. 6, no. 6, p. 2000154 (2020)). Due to these advantages, RRAM can be used in a variety of ways, such as for high-density non-volatile memory and neuromorphic computing applications. (See, e.g., M.-H. Kim et al., "Uniformity improvement of SiN x-based resistive switching memory by suppressed internal overshoot current," *IEEE Transactions on Nanotechnology*, vol. 17, no. 4, pp. 824-828 (2018)).

RRAM devices can exhibit high switching voltage and compliance current. In some instances, the operating voltages can be reduced by optimizing the switching layer materials and thicknesses. However, it can be difficult to reduce the programming current due to the formation of a weak conducting filament that diffuses spontaneously from cycle-to-cycle. (See, e.g., Y. Y. Chen et al., "Improvement of data retention in $HfO_2$/Hf 1T1R RRAM cell under low operating current," in 2013 *IEEE International Electron Devices Meeting*, IEEE, pp. 10.1. 1-10.1. 4 (2013)).

At the same time, low current programming capable RRAMs are essential for the successful commercialization of RRAM devices to reduce power consumption, mitigate series line resistance, and reduce the current density required for the programming circuitry and possible selector device integration. (See, e.g., S. Gaba et al., "Ultralow sub-1-nA operating current resistive memory with intrinsic non-linear characteristics," *IEEE Electron Device Letters*, vol. 35, no. 12, pp. 1239-1241 (2014)). It is further desired that RRAM should exhibit a continuous, uniform, and reliable change in its conductivity. However, highly reliable $SiO_2$ RRAM devices are known to exhibit a high operating current, which could be in the mA range. As such, improvement of the uniformity of resistive switching (RS) characteristics in RRAM devices is desired.

SUMMARY

Embodiments of the present disclosure provide an exemplary resistive random access memory (RRAM) device with a resistive switching (RS) layer having a bilayer structure that provided improved operation as compared to conventional RRAM devices. In particular, the RRAM device exhibits ultralow switching current in the nA range. The RRAM device having the improved operation can be used in a variety of applications, such as for low power and high-density data storage applications. The RRAM device also offers potential applications both in and beyond the memory space due to its simple structure, potential for high density, lower programming voltage, faster write/read speed, achievability of high endurance, and long retention. As such, the RRAM device can also be used in consumer electronics, e.g., mobile devices, tablets, laptops, wearable electronics, data center storage due to rapidly increasing usage of cloud computing and big data, in memory and neuromorphic computing, IoT applications, hardware and security applications such as true random number generator, physical unclonable unction due to stochastic behavior, or the like. The RRAM device exhibits a continuous, uniform and reliable change in its conductivity. The improved uniformity of resistive switching characteristics is demonstrated for $Pt/Ti/SiO_2/TiN/Ti$ RRAM devices by incorporating a $SiN_x$ layer before the top electrode layer at a reduced programming current of 10 nA, which also offers multi-level bit storage capability.

The RRAM device can be used as a universal memory that could replace both non volatile and volatile memory devices because of the advantageous simple structure, compatibility with existing CMOS technology, improved switching speed, and capability of scaling to the smallest dimensions. In some embodiments, the RRAM device can be used for fast operation and medium size storage density-based memory applications. The RRAM device includes the resistive layer sandwiched between top and bottom electrode layers. The RRAM device operates by changing the resistance across the dielectric/RS layer by the application of external voltage.

A highly uniform and stable RS, ultralow operating current (10 nA) of a $SiN_x/SiO_2$ RRAM device is disclosed. The RRAM device exhibited improved statistical distribution of device parameters along with a high $R_{off}/R_{on}$ ratio ($>10^3$). The RRAM device exhibited the capability of multi-bit resistive switching phenomena even at ultralow compliance currents. In accordance with embodiments of the present disclosure, an exemplary resistive random access memory (RRAM) device with highly uniform ultralow power resistive switching is provided. In some embodiments, the RAM device can be a $Pt/Ti/SiO_2/TiN/Ti$ RRAM device which incorporates a $SiN_x$ layer before a top electrode is added at a reduced programming current. In some embodiments, the $SiN_x$ layer can be positioned between the top electrode and the $SiO_2$ layer. In some embodiments, the current can be about 10 nA. In some embodiments, the current can be in the range of about, e.g., 0.1 nA-10 µA inclusive, 0.5 nA-10 µA inclusive, 1 nA-10 µA inclusive, 5 nA-10 µA, 10 nA-10 µA inclusive, 100 nA-10 µA inclusive, 200 nA-10 µA inclusive, 300 nA-10 µA inclusive, 400 nA-10 µA inclusive, 500 nA-10 µA inclusive, 600 nA-10 µA inclusive, 700 nA-10 µA inclusive, 800 nA-10 µA inclusive, 900 nA-10 µA inclusive, 1 µA-10 µA inclusive, 2 µA-10 µA inclusive, 3 µA-10 µA inclusive, 4 µA-10 µA inclusive, 5 µA-10 µA inclusive, 6 µA-10 µA inclusive, 7 µA-10 µA inclusive, 8 µA-10 µA inclusive, 9 µA-10 µA inclusive, 0.1 nA-9 µA inclusive, 0.1 nA-8 µA inclusive, 0.1 nA-7 µA inclusive, 0.1 nA-6 µA inclusive, 0.1 nA-5 µA inclusive, 0.1 nA-4 µA inclusive, 0.1 nA-3 µA inclusive, 0.1 nA-2 µA inclusive, 0.1 nA-1 µA inclusive, 0.1 nA-900 nA inclusive, 0.1 nA-800 nA inclusive, 0.1 nA-700 nA inclusive, 0.1 nA-600 nA inclusive, 0.1 nA-500 nA inclusive, 0.1 nA-400 nA inclusive, 0.1 nA-300 nA inclusive, 0.1 nA-200 nA inclusive, 0.1 nA-100 nA inclusive, 0.1 nA-10 nA inclusive, 0.1 nA-5 nA inclusive, 0.1 nA-1 nA inclusive, 0.1 nA-0.5 nA inclusive, 0.1 nA, 0.5 nA, 1 nA, 5 nA, 10 nA, 100 nA, 200 nA, 300 nA, 400 nA, 500 nA, 600 nA, 700 nA, 800 nA, 900 nA, 1 μA, 2 μA, 3 μA, 4 μA, 5 μA, 6 μA, 7 μA, 8 μA, 9 μA, 10 μA, or the like. The RRAM device has improved uniformity of resistive switching (RS) characteristics and multi-level bit storage capability.

In some embodiments, the RRAM device can include a top electrode, a bottom electrode, an insulating layer, and a $SiN_x$ layer positioned between the top electrode and the bottom electrode. The RRAM device can have a resistive switching current in the nA range noted herein. In some embodiments, the insulating layer can include a $SiO_2$ layer.

In some embodiments, an exemplary switching device is provided. The switching device can include a top electrode, a bottom electrode, and a resistive switching bilayer positioned between the top electrode and the bottom electrode. The switching device has a resistive switching current in the nA range noted herein. In some embodiments, the resistive switching bilayer can include $SiN_x/SiO_2$. In some embodiments, the main switching layer can be $SiO_2$. In some embodiments, a thin $SiN_x$ layer can be sized to control the formation of the conducting filament.

In accordance with embodiments of the present disclosure, an exemplary resistive random access memory (RRAM) device. The RRAM device includes a top electrode layer, a bottom electrode layer, and an insulating layer positioned between the top electrode layer and the bottom electrode layer. The insulating layer includes a $SiN_x$ layer.

The RRAM device has a resistive switching current in a nA range. The top electrode layer includes a Pt layer positioned over a Ti layer. In some embodiments, the Pt layer can be about 100 nm thick. In some embodiments, the Ti layer can be about 10 nm thick. The bottom electrode layer includes a TiN layer positioned over a Ti layer. In some embodiments, the TiN layer can be about 100 nm thick. In some embodiments, the Ti layer can be about 10 nm thick.

The RRAM device includes an F silica substrate. The bottom electrode layer is positioned on the F silica substrate. The insulating layer includes a $SiO_2$ layer positioned below the $SiN_x$ layer. In some embodiments, the $SiN_x$ layer can be about 5 nm thick. In some embodiments, the $SiO_2$ layer can be about 10 nm thick. The $SiN_x$ layer is positioned between the top electrode layer and the bottom electrode layer. The insulating layer is a resistive layer having a bilayer structure.

In accordance with embodiments of the present disclosure, an exemplary switching device is provided. The switching device includes a top electrode layer, a bottom electrode layer, and a resistive switching bilayer positioned between the top electrode layer and the bottom electrode layer.

The switching device has a resistive switching current in the nA range. The resistive switching bilayer includes $SiN_x/SiO_2$. In particular, the resistive switching bilayer includes a $SiN_x$ layer positioned over a $SiO_2$ layer. The top electrode layer includes a Pt layer positioned over a Ti layer. The bottom electrode layer includes a TiN layer positioned over a Ti layer.

In accordance with embodiments of the present disclosure, an exemplary method of operating a resistive random access memory (RRAM) device is provided. The method includes applying an external voltage to the RRAM device. The RRAM device includes a top electrode layer, a bottom electrode layer, and an insulating layer positioned between the top electrode layer and the bottom electrode layer. The insulating layer includes a $SiN_x$ layer. Application of the external voltage to the RRAM device changes the resistance across the insulating layer.

Any combination and/or permutation of the embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the disclosed RRAM device and associated systems and methods, reference is made to the accompanying figures, wherein:

FIG. 1 is a diagrammatic view of a traditional RRAM (R1) device with only a $SiO_2$ resistive switching (RS) layer.

FIG. 2A is a diagrammatic view of an exemplary RRAM (R2) device with a $SiN_x/SiO_2$ RS bilayer, and FIG. 2B is an optical image of the RRAM (R2) device shown in FIG. 2A, with the substrate of the RRAM devices being fused silica, silicon, gallium oxide, polymer, or any combination thereof.

DETAILED DESCRIPTION

Figures 3A, 3B:
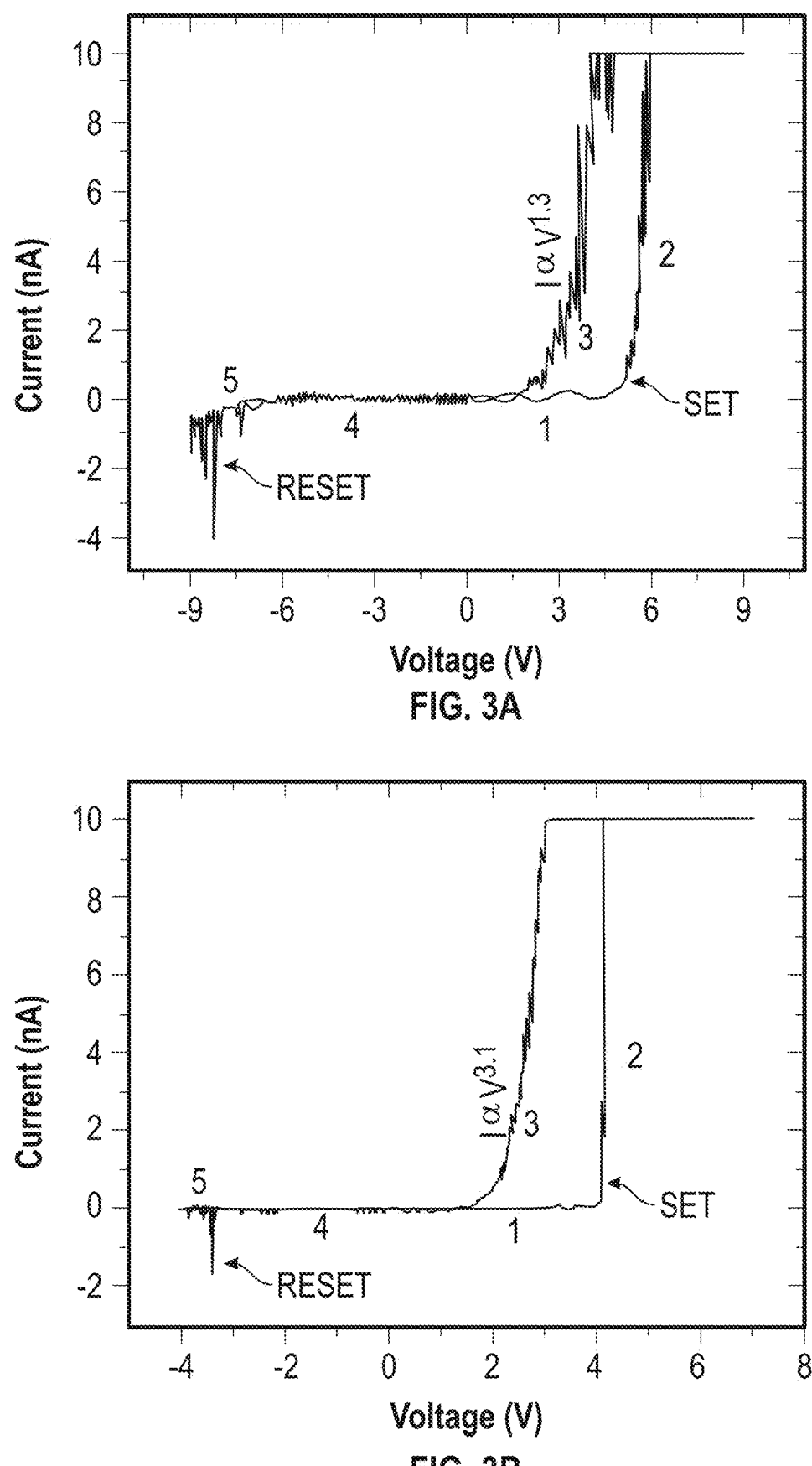
FIGS. 3A-3D are graphs illustrating current-voltage characteristics of a RRAM (R1) device (FIG. 3A), a RRAM (R2) device (FIG. 3B), a RRAM (R1) device of 50 cycles with an inset showing the statistical distribution of SET voltages of the RRAM R1 and R2 devices (FIG. 3C), and a RRAM (R2) device of 200 cycles with an inset showing the statistical distribution of RESET voltages of the RRAM R1 and R2 devices (FIG. 3D).

FIG. 1 shows a diagrammatic view of a traditional resistive random access memory (RRAM) device 100 (hereinafter "device 100"). The device 100 includes multiple layers, including a top electrode layer 102, a bottom electrode layer 104, and an intermediate insulating layer 106. The top electrode layer 102 includes a Pt layer 108 positioned over a Ti layer 110. In some embodiments, the Pt layer 108 can be about 100 nm thick and the Ti layer 110 can be about 10 nm thick. The thickness of the Pt layer 108 is dimensioned greater than the thickness of the Ti layer 110. The top electrode layer 102 can be disposed over the insulating layer 106 in a spaced manner, such that each of the respective Pt and Ti layer 108, 110 is offset from the next respective Pt and Ti layer 108, 110 by a gap 112.

The bottom electrode layer 104 includes a TiN layer 114 positioned over a Ti layer 116. In some embodiments, the TiN layer 114 can be about 100 nm thick and the Ti layer 116 can be about 10 nm thick. The thickness of the TiN layer 114 is dimensioned greater than the thickness of the Ti layer 116. In some embodiments, the TiN layer 114 thickness can be in the range of about, e.g., 50-250 nm inclusive, 50-200 nm inclusive, 50-150 nm inclusive, 50-100 nm inclusive, 50-75 nm inclusive, 75-250 nm inclusive, 100-250 nm inclusive, 150-250 nm inclusive, 200-250 nm inclusive, 50 nm, 75 nm, 100 nm, 150 nm, 200 nm, 250 nm, or the like. In some embodiments, the Ti layer 116 thickness can be in the range of about, e.g., 5-20 nm inclusive, 5-15 nm inclusive, 5-10 nm inclusive, 5-7 nm inclusive, 7-20 nm inclusive, 10-20 nm inclusive, 15-20 nm inclusive, 5 nm, 7 nm, 10 nm, 15 nm, 20 nm, or the like. The intermediate insulating layer 106 includes a single $SiO_2$ resistive switching (RS) layer 118. In some embodiments, the RS layer 118 can be about 10 nm thick. In some embodiments, the RS layer 118 thickness can be in the range of about, e.g., 0.5-50 nm inclusive, 0.5-45 nm inclusive, 0.5-40 nm inclusive, 0.5-35 nm inclusive, 0.5-30 nm inclusive, 0.5-25 nm inclusive, 0.5-20 nm inclusive, 0.5-15 nm inclusive, 0.5-10 nm inclusive, 0.5-7 nm inclusive, 0.5-5 nm inclusive, 0.5-3 nm inclusive, 0.5-2 nm inclusive, 0.5-1 nm inclusive, 1-50 nm inclusive, 2-50 nm inclusive, 3-50 nm inclusive, 5-50 nm inclusive, 7-50 nm inclusive, 10-50 nm inclusive, 15-50 nm inclusive, 20-50 nm inclusive, 25-50 nm inclusive, 30-50 nm inclusive, 35-50 nm inclusive, 40-50 nm inclusive, 45-50 nm inclusive, 0.5 nm, 1 nm, 2 nm, 3 nm, 5 nm, 7 nm, 10 nm, 15 nm, 20 nm, 25 nm, 30 nm, 35 nm, 40 nm, 45 nm, 50 nm, or the like. The bottom electrode layer 104 is positioned on an F silica substrate 120. The device 100 of FIG. 1 may be referred to herein as the "R1" device.

FIG. 2A shows a diagrammatic view of an exemplary resistive random access memory (RRAM) device 200 (herein after "device 200"). The device 200 can be substantially similar in structure to the device 100, except for the distinctions and improvements noted herein. As such, like reference numbers refer to like structures. The device 200 includes the top electrode layer 102 with the Pt layer 108 over the Ti layer 110, and the bottom electrode layer 104 with the TiN 114 layer positioned over the Ti layer 116. The device 200 also includes the F silica substrate 120 disposed below the bottom electrode layer 104. However, rather than a single insulating layer 106, the insulating layer 202 of the device 200 includes a SiN layer 204 positioned over a $SiO_2$ layer 206, which collectively act as a resistive switching (RS) layer. The $SiN_x/SiO_2$ RS layer is therefore a bilayer. In some embodiments, the SiN layer 204 can be about 5 nm thick and the $SiO_2$ layer 206 can be about 10 nm thick. The $SiO_2$ layer 206 is dimensioned greater in thickness than the SiN layer 204. In general, the insulating layer 202 is dimensioned smaller than the bottom electrode layer 104. In some embodiments, top electrode layer 102 and the insulating layer 202 of the device 200 are dimensioned equally (or substantially equally). In some embodiments, the SiN layer 204 thickness can be in the range of about, e.g., 0.5-20 nm inclusive, 0.5-15 nm inclusive, 0.5-10 nm inclusive, 0.5-7 nm inclusive, 0.5-5 nm inclusive, 0.5-3 nm inclusive, 0.5-2 nm inclusive, 0.5-1 nm inclusive, 1-20 nm inclusive, 2-20 nm inclusive, 3-20 nm inclusive, 5-20 nm inclusive, 7-20 nm inclusive, 10-20 nm inclusive, 15-20 nm inclusive, 0.5 nm, 1 nm, 2 nm, 3 nm, 5 nm, 7 nm, 10 nm, 15 nm, 20 nm, or the like. In some embodiments, the $SiO_2$ layer 206 thickness can be in the range of about, e.g., 0.5-50 nm inclusive, 0.5-45 nm inclusive, 0.5-40 nm inclusive, 0.5-35 nm inclusive, 0.5-30 nm inclusive, 0.5-25 nm inclusive, 0.5-20 nm inclusive, 0.5-15 nm inclusive, 0.5-10 nm inclusive, 0.5-7 nm inclusive, 0.5-5 nm inclusive, 0.5-3 nm inclusive, 0.5-2 nm inclusive, 0.5-1 nm inclusive, 1-50 nm inclusive, 2-50 nm inclusive, 3-50 nm inclusive, 5-50 nm inclusive, 7-50 nm inclusive, 10-50 nm inclusive, 15-50 nm inclusive, 20-50 nm inclusive, 25-50 nm inclusive, 30-50 nm inclusive, 35-50 nm inclusive, 40-50 nm inclusive, 45-50 nm inclusive, 0.5 nm, 1 nm, 2 nm, 3 nm, 5 nm, 7 nm, 10 nm, 15 nm, 20 nm, 25 nm, 30 nm, 35 nm, 40 nm, 45 nm, 50 nm, or the like. The device 200 of FIG. 2A may be referred to herein as the "R2" device. In some embodiments, the device 200 area (as measured along the top surface) can be in the range of about, e.g., $1\times1$ $nm^2$-$100\times100$ $\mu m^2$ inclusive, $1\times1$ $nm^2$-$50\times50$ $\mu m^2$ inclusive, $1\times1$ $nm^2$-$1\times1$ $\mu m^2$ inclusive, $1\times1$ $nm^2$-$800\times800$ $nm^2$ inclusive, $1\times1$ $nm^2$ $600\times$ $600$ $nm^2$ inclusive, $1\times1$ $nm^2$-$500\times500$ $nm^2$ inclusive, $1\times1$ $nm^2$-$300\times300$ $nm^2$ inclusive, $1\times1$ $nm^2$-$100\times100$ $nm^2$ inclusive, $1\times1$ $nm^2$-$50\times50$ $nm^2$ inclusive, $50\times50$ $nm^2$-$100\times100$ $\mu m^2$ inclusive, $100\times100$ $nm^2$-$100\times100$ $\mu m^2$ inclusive, $300\times300$ $nm^2$-$100\times100$ $\mu m^2$ inclusive, $500\times500$ $nm^2$-$100\times100$ $\mu m^2$ inclusive, $600\times600$ $nm^2$-$100\times100$ $\mu m^2$ inclusive, $800\times800$ $nm^2$-$100\times100$ $\mu m^2$ inclusive, $1\times1$ $\mu m^2$-$100\times100$ $\mu m^2$ inclusive, $50\times50$ $\mu m$ 2 $100\times100$ $\mu m^2$ inclusive, $1\times1$ $nm^2$, $50\times50$ $nm^2$, $100\times100$ $nm^2$, $300\times300$ $nm^2$, $500\times500$ $nm^2$, $600\times600$ $nm^2$, $800\times800$ $nm^2$, $1\times1$ $\mu m^2$, $50\times50$ $\mu m^2$, $100\times100$ $\mu m^2$, or the like FIG. 2B illustrates an optical image of the R2 device 200 shown in FIG. 2A. As illustrated in FIG. 2B, the gap 112 between the respective top electrode layers 102 is in both directions, resulting in a grid of spaced Pt and Ti layers 108, 110 that can generally define a square configuration.

Still with reference to FIG. 2A, the RRAM device 200 includes multiple layers. The Pt and Ti layers 108, 110 serve as the top electrode (TE) layer 102. The TE serves to attract, react with oxygen ions, and support the reaction with oxygen ions to form an oxygen reservoir at top electrode layer 102 and RS layer 202 interface. In particular, the reaction with oxygen ions forms an oxygen reservoir within the gaps 112 along the top surface of the insulating layer 202. The TiN and Ti layers 114, 116 serve as the bottom electrode (BE) layer 104. The TE and BE serve as a transportation path for carriers. The $SiO_2$ layer 206 serves as a resistive switching (RS) layer and forms a conductive filament within this layer with the help of the TE and BE layers 102, 104. The $SiN_x$ layer 204 helps to create additional vacancies in the RRAM device 200 within the gaps 112.

As shown in FIG. 2A, the ($SiN_x/SiO_2$) RS bilayer (i., the insulating layer 202) is positioned between the top electrode and the bottom electrode layers 102, 104. In some embodiments, the number of layers can vary and the amount of materials in each layer of the device 200 can vary (e.g., in the top electrode layer 102, the bottom electrode layer 104, the insulating layer 202, combinations thereof, or the like). In some embodiments, materials other than $SiN_x/SiO_2$ can be used as the RS layer 202, e.g., $SiN_x/HfO_2$, III(In, Al, Ga, B)Nx/III(In, Al, Ga, B)Ox, or the like. In some embodiments, materials other than Pt and Ti can be used as the top electrode layer 102, and TiN and Ti can be used as the bottom electrode layer 104, e.g., elementary substance electrodes (Ag, Cu, Al, Ti, W, Pt, Au, Ru, graphene, and carbon nanotubes), silicon-based electrodes (n-type Si and p-type Si), alloy electrodes (Pt—Al, Cu—Ti, Cu—Te, and Pt—Ti), oxide electrodes (In-doped ZnO, Al-doped ZnO, Ga-doped ZnO, and ITO), and nitrite-based electrodes (TiN and TaN). In some embodiments, a combination of different nitride materials with oxide can be used. However, in each instance, the insulating layer 202 includes an additional layer to the $SiO_2$ layer 206.

The RS performance was analyzed in a conventional single RS layer 118 ($SiO_2$) of the RRAM device 100 of FIG. 1, and in a bi-RS layers ($SiN_x/SiO_2$) RRAM device 200 of FIG. 2A. As discussed above, the device 100 structure of a single RS layer RRAM (R1) of FIG. 1 is generally Ti (10 nm)/TiN (100 nm)/SiO$_2$ (15 nm)/Ti (10 nm)/Pt (100 nm), which is fabricated with a device size of about 100×100 μm$^2$ on a fused silica substrate 120. In some embodiment, the R2 device 200 shown in FIG. 2A is a bi-RS layer that can includes a structure of Ti (10 nm)/TiN (100 nm)/SiN$_x$ (5 nm)/SiO$_2$ (15 nm)/Ti (10 nm)/Pt (100 nm). In some embodiments, the thickness of the SiO$_2$ layer 206 is dimensioned greater than the SiNx layer 204.

In some embodiments, the main switching layer in the R2 device 200 is the SiO$_2$ layer 206. The thin SiN$_x$ layer 204 is sized to control the formation of the conducting filament. The thin SiN$_x$ layer 204 can also be used to create additional vacancies. The thin SiNx layer 204 is responsible for the filament formation with one side including the stronger base and the other side including the weak base. The thin SiNx layer 204 is integrated such that the filament is not fully refreshed during each memory cycle operation. The thin SiNx layer 204 supports the uniform switching over the memory cell cycling.

The materials and the methods of the present disclosure used for the device 200 are discussed herein. While the embodiment discusses the use of specific compounds and materials, it should be understood that the present disclosure can use other suitable compounds or materials. Similar quantities or measurements can be substituted without altering the method embodied below.

In some embodiments, fused silica was used as the device substrate 120. First, the wafer was cleaned using acetone and IPA to remove organic contamination. The cleaned wafers were blown off in nitrogen. The BE layer 104 that includes Ti and TiN layers 116, 114 were then sputter-deposited using an AJA sputter tool. During the deposition process, the first Ar cleaning was done at a flow of about 40 sccm and a pressure of about 16 mTorr for 60 sec. A 10 nm Ti layer 116 was then deposited at a pressure of about 3 mTorr, a power of about 400 W, and Ar flow of about 30 sccm. A 100 nm TiN layer 114 was reactive sputtered on the Ti layer 116 at a pressure of about 3 mTorr, a power of about 400 W, and Ar and N$_2$ flow of about 15 sccm.

Next, a SiO$_2$ film (for layer 206) on the R1 device 100, and SiO$_2$ and SiN$_x$ films (for layers 206, 204) on the R2 device 200, were deposited using the Oxford ALD FlexAL. Tris(Dimethylamino)Silane (3DMAS) was used as the metal precursor for the deposition. During the growth process, the substrate 120 temperature was set at about 300° C. and about 350° C., RF power was maintained at about 300 W and about 290 W, and chamber pressure was held at about 15 mtorr and about 10 mtorr for SiO$_2$ and SiN$_x$, respectively. The flow rates of Ar/O$_2$ and Ar/N$_2$ are about 20/40 sccm and about 20/40 sccm while depositing SiO$_2$ and SiN$_x$, respectively. Finally, the wafer was loaded into the e-beam evaporator chamber for the top metal deposition. During the evaporation, a 10 nm Ti layer 110 was evaporated, followed by a 100 nm Pt layer 108, which serves as the TE layer 102. The optical image of the fabricated devices is shown in FIG. 2B. The electrical characterization of the RRAM devices 100, 200 was performed using the Keysight B 1500A semiconductor device parameter analyzer. The voltage bias was applied on the top electrode (TE) layer 102 and the bottom electrode (BE) layer 104 was grounded.

Current-voltage (I-V) characteristics of a R1 device 100 (SiO$_2$ RS layer 118) and the R2 device 200 (SiN$_x$/SiO$_2$ layers 204, 206) are illustrated in FIGS. 3A-3B. Fundamentally, when a positive voltage is being applied to the TE layer 102, the RRAM device 200 switches from its high resistance state (HRS) to a low resistance state (LRS), and the process is called the SET process. The RRAM device 200 transitions back to the HRS from LRS by applying a negative voltage to the TE layer 102, and the process is called the RESET process. Primarily, bipolar RS can be observed in both R1 and R2 devices 100, 200, and they report SET voltages ($V_{SET}$) of about −5V and about −4V, respectively. The RESET voltages ($V_{RESET}$) of these devices 100, 200 was measured as about −7V and about −3.5V, respectively. The current conduction mechanisms of the R1 and R2 devices 100, 200 was also investigated. During the LRS (denoted as #3 in FIG. 3A), the current conduction of the R1 device 100 is dominated by the Ohmic conduction (FIG. 3A). Therefore, a continuous filament is formed between the TE and BE layers 102, 104 of the R1 device 100 after the SET process, which is conductive and exhibits Ohmic conduction behavior in LRS. (See, e.g., J.-W. Huang et al., "The effect of high/low permittivity in bilayer HfO$_2$/BN resistance random access memory," *Applied Physics Letters*, vol. 102, no. 20, p. 203507 (2013)).

Figure 3C:
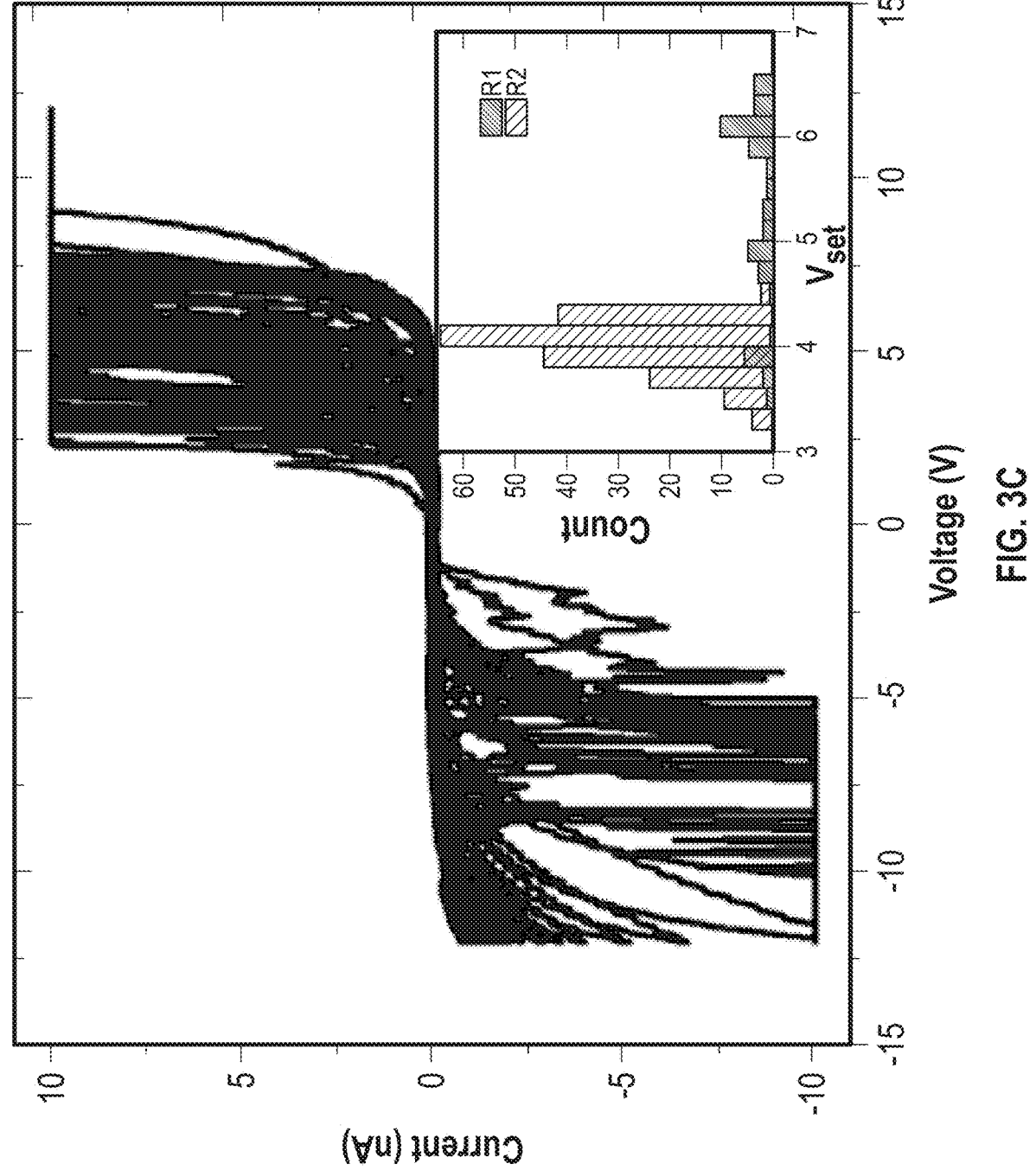

With respect to FIG. 3B, the current conduction in the LRS of the bilayer R2 device 200 is supported by the space-charge limited current (SCLC) conduction mechanism, which supports the filament formation with a strong base. (See, e.g., S. Gaba et al., "Ultralow sub-1-nA operating current resistive memory with intrinsic non-linear characteristics," *IEEE Electron Device Letters*, vol. 35, no. 12, pp. 1239-1241 (2014); N. Vasileiadis et al., "Understanding the role of defects in silicon nitride-based resistive switching memories through oxygen doping," *IEEE Transactions on Nanotechnology*, vol. 20, pp. 356-364 (2021); and Y. Yang et al., "Observation of conducting filament growth in nanoscale resistive memories," *Nature communications*, vol. 3, no. 1, pp. 1-8 (2012)). Overall, the compliance current ($I_{cc}$=10 nA) controls the amount of current that flows through the device 200 during the LRS state. Although the RS has been seen in the R1 device 100 even at 10 nA lower $I_{cc}$, the poor uniformity in I-V characteristics from cycle to cycle is also reported in FIG. 3C. This is mainly due to the formation of a weaker conducting filament at low $I_{cc}$, which is highly unstable and fluctuates over time in the R1 device 100. (See, e.g., P. Bousoulas et al., "Low-power and highly uniform 3-b multilevel switching in forming free TiO 2-x-based RRAM with embedded Pt nanocrystals," *IEEE Electron Device Letters*, vol. 37, no. 7, pp. 874-877 (2016); and Y. Huang et al., "Amorphous ZnO based resistive random access memory," *RSC advances*, vol. 6, no. 22, pp. 17867-17872 (2016)). From the inset of FIGS. 3C and 3D, the non-overlapping window between these $V_{SET}$ and $V_{RESET}$ in the R1 device 100 is about 5V between the two resistance states of LRS and HRS, which is essential for the RRAM applications. (See, e.g., D. Guo et al., "Unipolar resistive switching behavior of amorphous gallium oxide thin films for nonvolatile memory applications," *Applied Physics Letters*, vol. 106, no. 4, p. 042105 (2015)). However, the $V_{SET}$ is seen to vary in a wide range, i.e. about −3V to about 7V, and $V_{RESET}$ in the range of about −2V to about −10V, which is not desirable.

Overall, the memory cell in the R1 device 100 exhibits poor uniformity and is unstable from a cycle-to-cycle operation, which is one of the significant factors that limit manufacturing on a wider scale, especially for low-power applications. Further, it was observed that the cycle-to-cycle variability in the R1 device 100 was mostly dependent on the number of oxygen vacancies that occur in the formation of the conducting filament (CF). (See, e.g., G. Gonzalez-Cordero et al., "In-depth study of the physics behind resistive switching in TiN/Ti/HfO2/W structures," *Journal of*

*Vacuum Science & Technology B, Nanotechnology and Microelectronics: Materials, Processing, Measurement, and Phenomena*, vol. 35, no. 1, p. 01A110 (2017)). Due to the involvement of the random nature of formation of the conducting filament, it is extremely difficult to control and modulate the conducting filament. This variability becomes worse with the reduction of the compliance limit (i.e., the nA range).

Figure 3D:
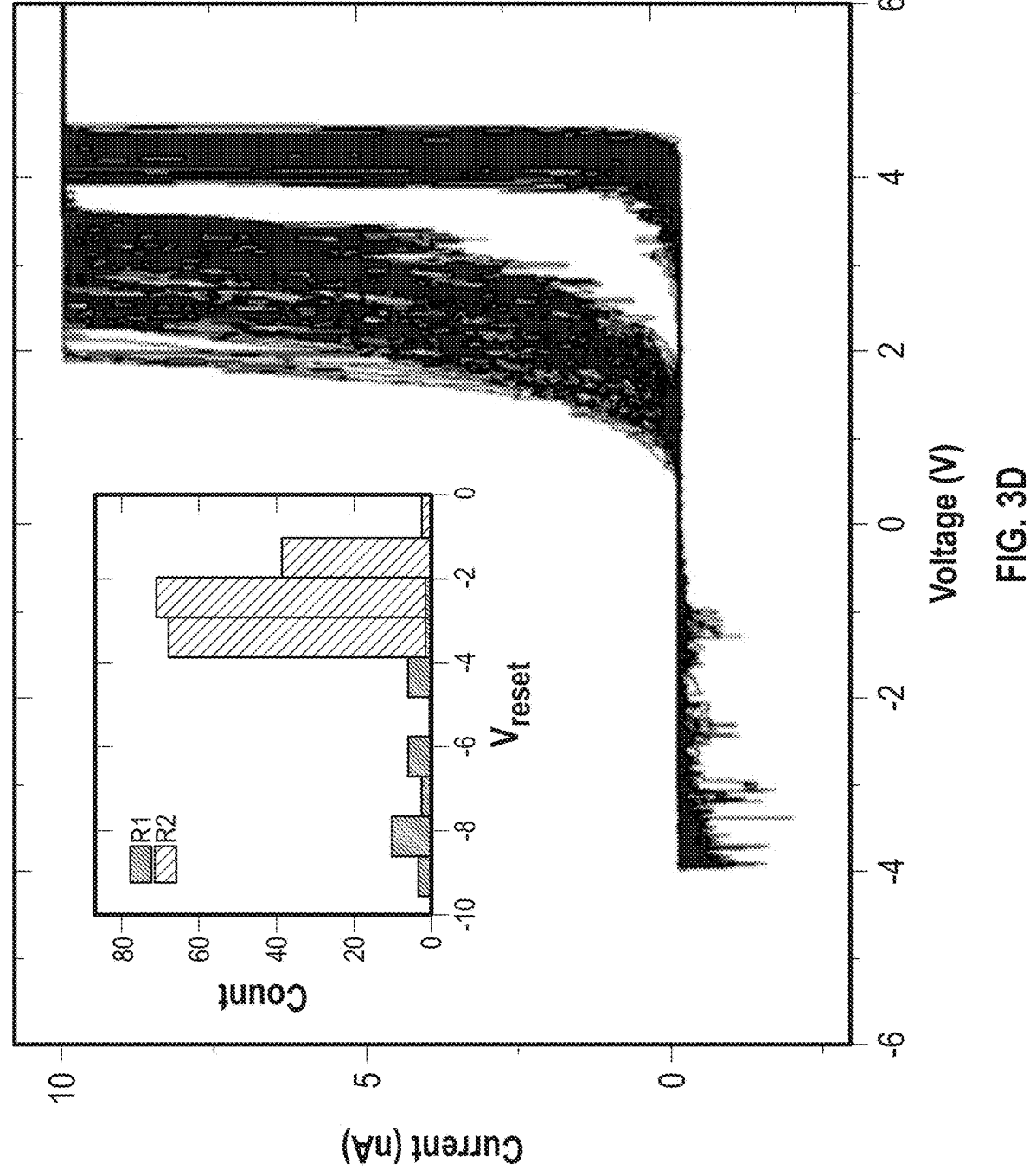

The introduction of the SiNx layer 204 in the bilayer RRAM device 200 of the present disclosure results in uniform resistive switching even at a low current, such as about 10 nA $I_{cc}$, due to the possibility of filament formation with a stronger base and corresponding I-V characteristics, as can be seen in FIG. 3D. As a result, the $V_{SET}$ and $V_{RESET}$ distributions of the R2 device 200 are about 3.3V to about 4.7V, about −0.5V to about −3.5V, which are more concentrative than the R1 device 100.

Figures 4A, 4B:
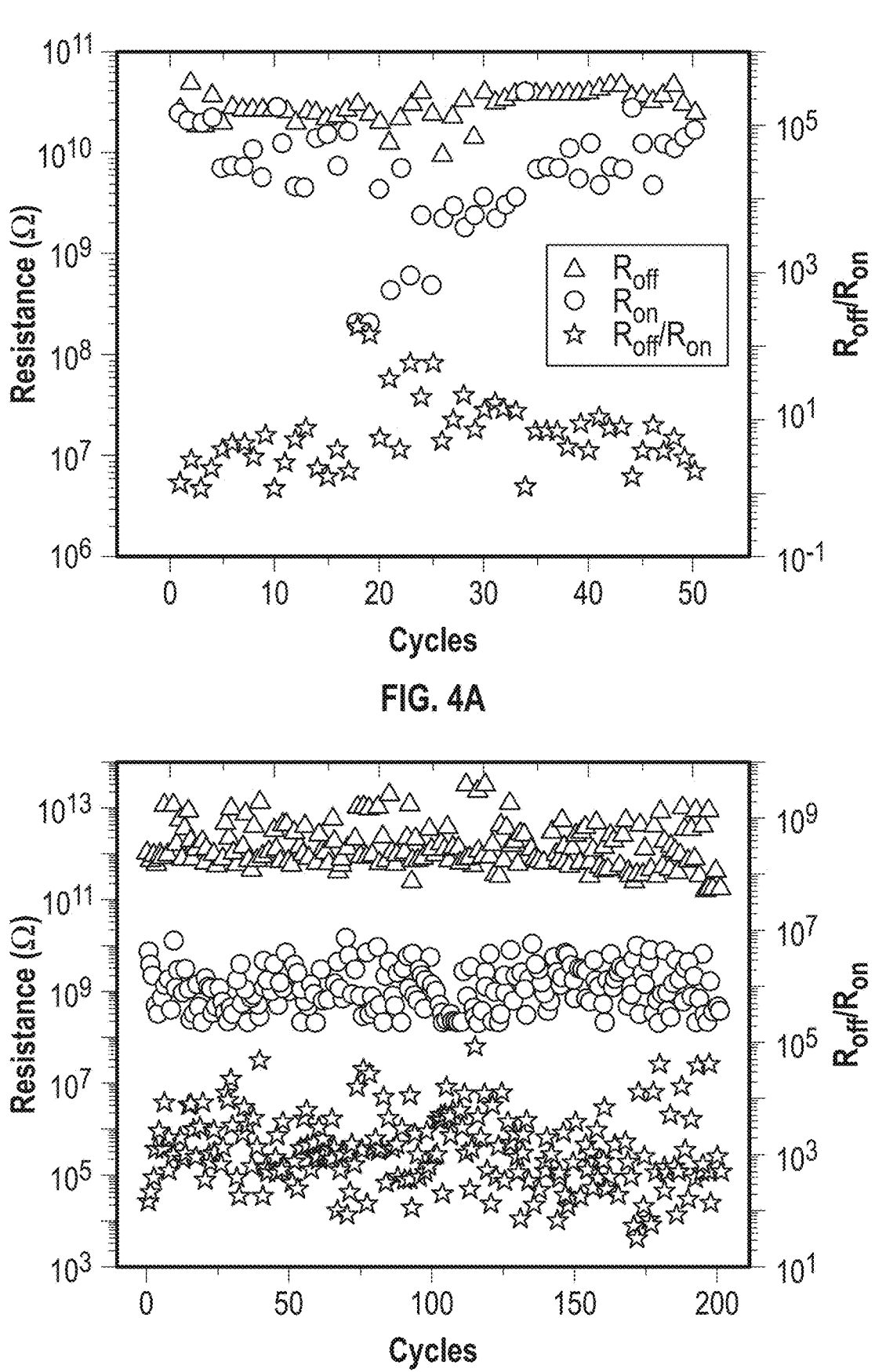
FIGS. 4A-4D are graphs illustrating distributions of HRS ($R_{off}$), LRS($R_{on}$), and $R_{off}/R_{on}$ of a RRAM (R1) device (FIG. 4A), a RRAM (R2) device (FIG. 4B), cumulative distributions of resistance of RRAM R1 and R2 devices measured at 2V (FIG. 4C), and $R_{off}$, $R_{on}$, and $R_{off}/R_{on}$ values at 10 nA, 20 nA, and 30 nA, respectively (FIG. 4D).
Figure 4C:
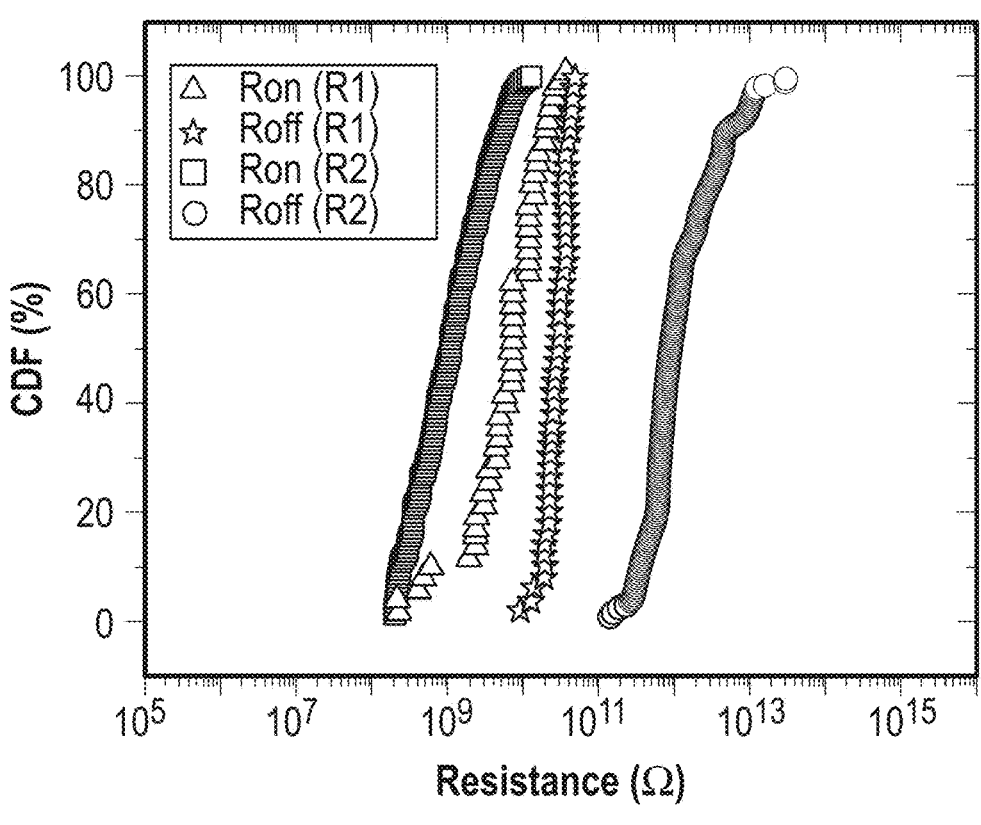
Figure 4D:
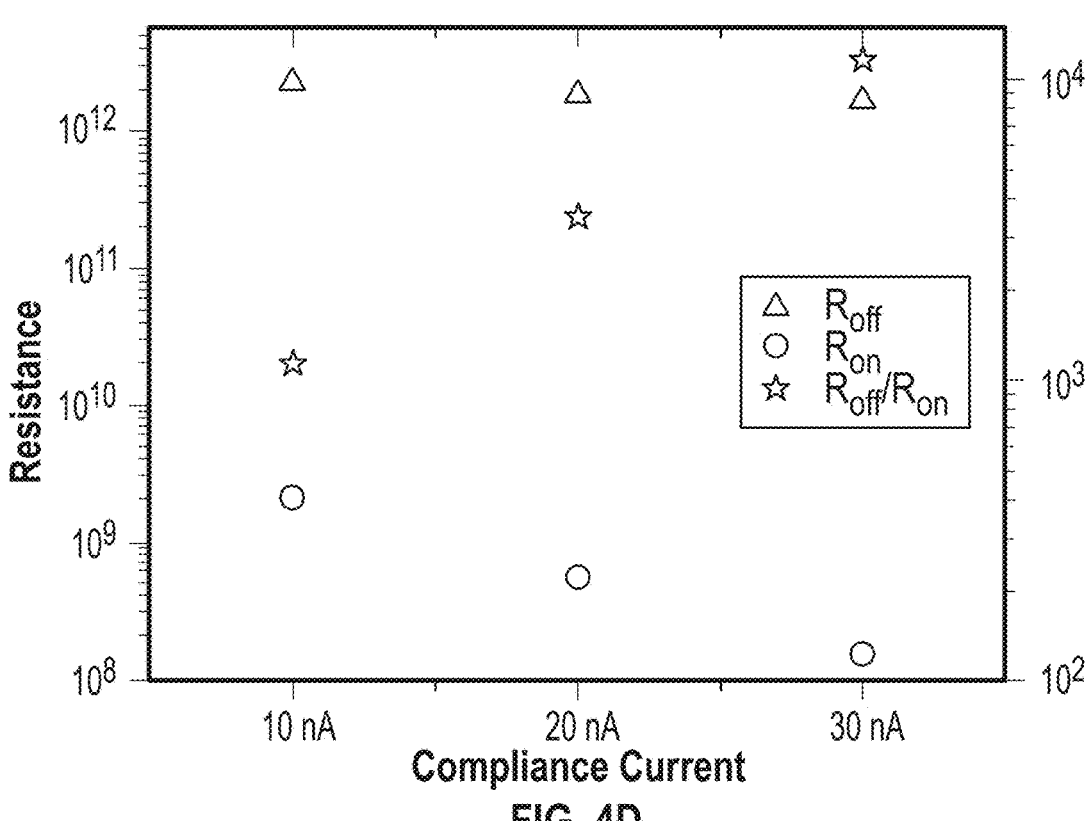

FIGS. 4A and 4B show the resistance states profiles of the R1 and R2 devices 100, 200 for HRS($R_{off}$) and LRS($R_{on}$). As expected, the R1 device 100 exhibited non-uniform and unstable resistance levels during HRS and LRS due to the formation of a weak conduction filament, which has a higher probability to fluctuate from a cycle-to-cycle operation. Subsequently, the average $R_{off}/R_{on}$ value for the R1 device 100 was about 12. Cumulative distributions of resistance states for both the R1 and R2 devices 100, 200 are presented in FIG. 4C. In the R1 memory cell, occasionally leaky LRS has been found (bottom circle in FIG. 4C), it is necessary to reduce LRS current for better RESET. In addition, HRS and LRS are difficult to distinguish (top circle in FIG. 4C during some of the cycle operations) due to an inefficient way of filament formation, which remains the R1 device 100 in HRS. The filament formation is critical and is further optimized/controlled in the R2 device 200.

Compared to the resistance states profile of the R1 device 100, the R2 device 200 shows more stable and uniform distribution, which is due to the stable resistance transition during SET and RESET operations. Moreover, it can be understood that the significantly improved performance in the R2 device 200 is due to the filament formation with a stronger base that modulates the $R_{off}$ and $R_{on}$ by the integration of the SiNx layer 204. As a result, notably, uniform $R_{off}$ and $R_{on}$ values are reported and the $R_{off}/R_{on}$ of the R2 device 200 is well maintained with an average value of 3,500 compared to the R1 device 100, as shown in FIG. 4B. Further, the greatly improved performance can be understood from the cumulative distribution profile of the R2 device 200 from FIG. 4C.

Next, the multilevel switching possibility of the R2 device 200 was examined. The average $R_{on}$, $R_{off}$ and $R_{off}/R_{on}$ ratios for 25 cycles of different $I_{cc}$ (10 nA, 20 nA, and 30 nA) is shown in FIG. 3D. With the increase in $I_{cc}$ from 10 nA to 30 nA, $R_{on}$ shows a trend that leads to three different LRS states whereas the $R_{off}$ remains almost constant for all $I_{cc}$. As a result, with the increase of $I_{cc}$, the $R_{off}/R_{on}$ ratio is increased, which validates the multi-level switching properties of the structure of the present disclosure. As the multilevel switching behavior is observed for very low currents in nA, the R2 device 200 is suitable for low-power applications. As such, the observations in FIGS. 4A-4D support the improved operation of the R2 device 200 as compared to the R1 device 100.

Figures 5A, 5B, 5C, 5D, 5E, 5F:
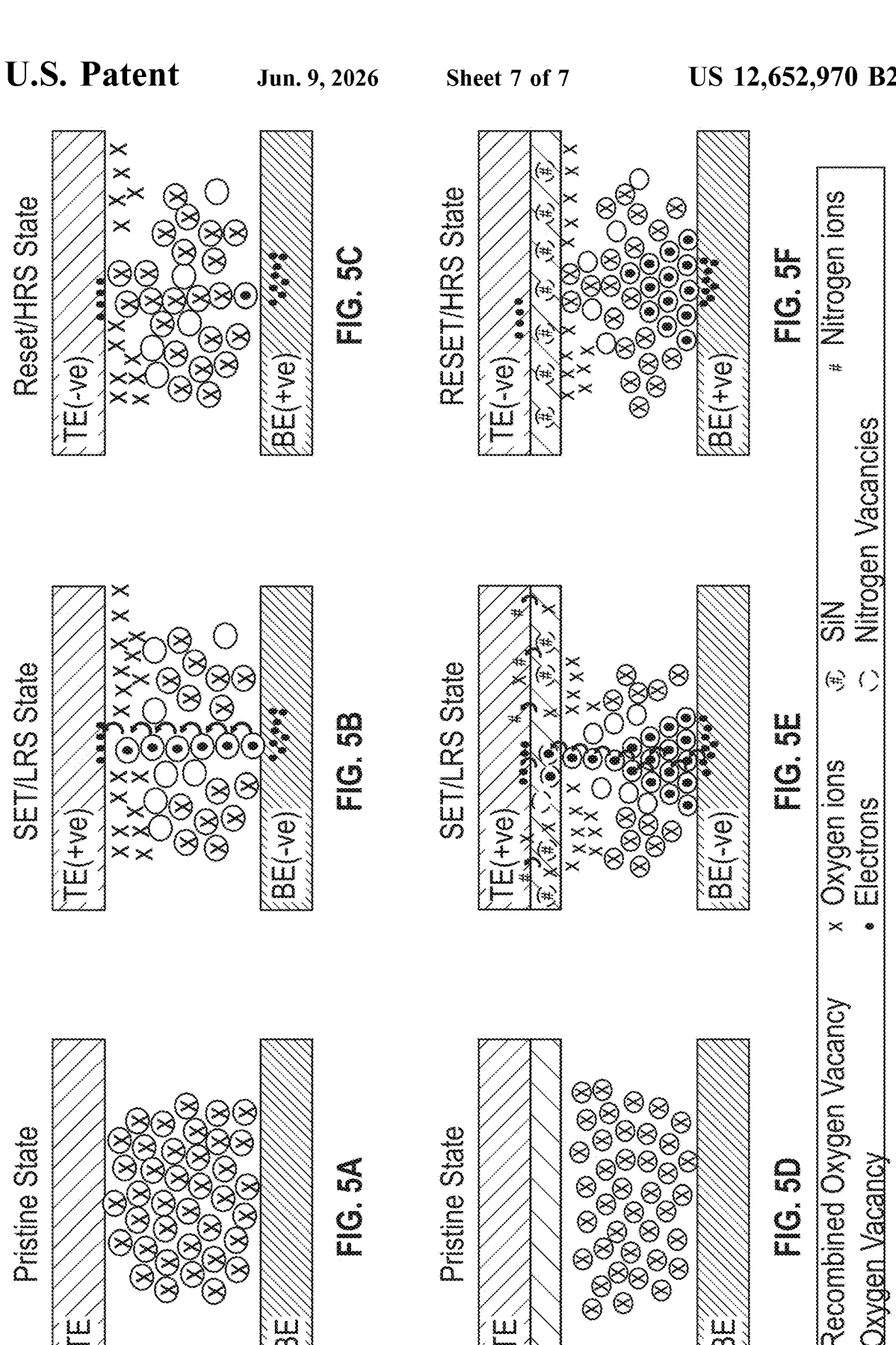
FIGS. 5A-5F shows models for a pristine state of a RRAM (R1) device (FIG. 5A), a LRS state of the RRAM (R1) device (FIG. 5B), a HRS state of the RRAM (R1) device (FIG. 5C), a pristine state of a RRAM (R2) device (FIG. 5D), a LRS state of the RRAM (R2) device (FIG. 5E), and a HRS state of the RRAM (R2) device (FIG. 5F).

FIGS. 5A-5C and FIGS. 5D-5F represent the schematic diagrams of RS processes in R1 and R2 devices 100, 200, respectively. At first, both the pristine memory devices 100, 200 are in a reset state, as seen in FIG. 5A and FIG. 5D. With the application of positive voltage to the TE, oxygen ions are attracted toward the TE and leave the oxygen vacancies behind. Once sufficient oxygen vacancies are available in the switching layer for the electrons to hop through it and reach the TE, the current starts flowing through the device 100, 200 and the device 100, 200 changes to a set state. This is the usual scenario in the R1 device 100 (FIG. 5B). In addition to the above-mentioned mechanism, two more additional mechanisms are involved in the case of the R2 device 200 to generate excess vacancies. First, during the pristine state of the R2 device 200, a part of Ti exists as metal Ti, the other part reacts with N and forms silicon dangling bonds (Si DBs) at the Ti/SiN$_x$ interface. During the SET process, Si—N bonds can be broken, N ions become attracted to the top electrode and leave behind the nitrogen vacancies. The process can be described by Equation 1 (see, e.g., J. Guo et al., "Influence of Nitrogen Adsorption of Doped Ta on Characteristics of SiN$_x$-Based Resistive Random Access Memory," *physica status solidi (a)*, vol. 216, no. 22, p. 1900540 (2019)), $$\text{Si—N+Ti} \rightarrow = \text{Si+Ti—N} \tag{1}$$

where Si—N; Ti; =Si; and Ti—N are the bonded silicon, Ti metal, Si DBs, and Ti nitride, respectively. Secondly, in addition to Si DBs at the SiN$_x$/TE interface, the presence of Si dangling bonds (DBs) at the interface of SiN$_x$/SiO$_2$ attracts relatively higher number of oxygen ions compared to the R1 device 100 toward it and leaves oxygen vacancies behind. Some of those attracted oxygen ions will be captured by the Si DBs and the remaining uncaptured oxygen ions would continue migrating to the top electrode and generate TiO$_2$ at the interface of Ti/SiN, because Ti is known as an excellent oxygen reservoir. (See, e.g., H. Jeon et al., "Resistive switching behaviors of Ti nano-layer embedded TaOx-based devices," *Current Applied Physics*, vol. 17, no. 2, pp. 230-234 (2017)).

$$\text{O''+=S} \rightarrow \text{Si—O+O} \tag{2}$$

$$\text{O''+Ti} \rightarrow \text{Ti—O+O} \tag{3}$$

Equations 2 and 3 represent the oxygen ion and vacancy relationship, where O", =Si, Si—O, O··, Ti and Ti—O are the oxygen ion, Si-DBs, Si oxide, oxygen vacancy, Ti metal and Ti nitride, respectively. As a result, a higher number of oxygen vacancies will be generated in the R2 device 200 structure, and it forms a conductive filament with a stronger base (see, e.g., Y. Yang et al., "Observation of conducting filament growth in nanoscale resistive memories," *Nature communications*, vol. 3, no. 1, pp. 1-8 (2012)) with a weak tip on the another side, as shown in FIG. 5E. During the RESET process in the R1 device 100 (FIG. 5C), spontaneous diffusion of filament takes place due to the weaker filament and which is responsible for the unstable RS characteristics. In contrast, in the R2 device 200 (FIG. 5E), the conduction filament breaks only around weak tip, which offers uniform and stable RS characteristics.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A resistive random access memory (RRAM) device, comprising:
   a top electrode layer;
   a bottom electrode layer; and
   an insulating layer positioned between the top electrode layer and the bottom electrode layer, the insulating layer including a $SiN_x$ layer;
   wherein the insulating layer comprises a $SiO_2$ layer positioned below the $SiN_x$ layer.

2. The RRAM device of claim 1, wherein the RRAM device has a resistive switching current in a nA range.

3. The RRAM device of claim 1, wherein the top electrode layer includes a Pt layer positioned over a Ti layer.

4. The RRAM device of claim 3, wherein the Pt layer is about 100 nm thick.

5. The RRAM device of claim 3, wherein the Ti layer is about 10 nm thick.

6. The RRAM device of claim 1, wherein the bottom electrode layer includes a TiN layer positioned over a Ti layer.

7. The RRAM device of claim 6, wherein the TiN layer is about 100 nm thick.

8. The RRAM device of claim 6, wherein the Ti layer is about 10 nm thick.

9. The RRAM device of claim 1, comprising an F silica substrate, wherein the bottom electrode layer is positioned on the F silica substrate.

10. The RRAM device of claim 1, wherein the $SiN_x$ layer is about 5 nm thick.

11. The RRAM device of claim 1, wherein the $SiO_2$ layer is about 10 nm thick.

12. The RRAM device of claim 1, wherein the $SiN_x$ layer is positioned between the top electrode layer and the bottom electrode layer.

13. The RRAM device of claim 1, wherein the insulating layer is a resistive layer having a bilayer structure.

14. A switching device, comprising:
   a top electrode layer;
   a bottom electrode layer; and
   a resistive switching bilayer positioned between the top electrode layer and the bottom electrode layer;
   wherein the resistive switching bilayer includes $SiN_x$/$SiO_2$.

15. The switching device of claim 14, wherein the switching device has a resistive switching current in the nA range.

16. The switching device of claim 14, wherein the resistive switching bilayer includes a $SiN_x$ layer positioned over a $SiO_2$ layer.

17. The switching device of claim 14, wherein:
   the top electrode layer includes a Pt layer positioned over a Ti layer; and
   the bottom electrode layer includes a TiN layer positioned over a Ti layer.

18. A method of operating a resistive random access memory (RRAM) device, comprising:
   applying an external voltage to the RRAM device, the RRAM device including (i) a top electrode layer, (ii) a bottom electrode layer, and (iii) an insulating layer positioned between the top electrode layer and the bottom electrode layer, the insulating layer including a $SiN_x$ layer and the insulating layer comprises a $SiO_2$ layer positioned below the $SiN_x$ layer;
   wherein application of the external voltage to the RRAM device changes the resistance across the insulating layer.

* * * * *